(12) United States Patent
Guo et al.

(10) Patent No.: US 12,354,922 B2
(45) Date of Patent: Jul. 8, 2025

(54) CONTAMINATION DETECTION METHOD

(71) Applicant: Texas Instruments Incorporated, Dallas, TX (US)

(72) Inventors: Honglin Guo, Dallas, TX (US); Robert M. Higgins, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 271 days.

(21) Appl. No.: 17/746,655

(22) Filed: May 17, 2022

(65) Prior Publication Data
US 2023/0378005 A1    Nov. 23, 2023

(51) Int. Cl.
*H01L 21/66*    (2006.01)
(52) U.S. Cl.
CPC .................................. *H01L 22/34* (2013.01)
(58) Field of Classification Search
CPC ...... H01L 22/34; H01L 22/12; H01L 27/0805
See application file for complete search history.

(56) References Cited

U.S. PATENT DOCUMENTS

2016/0126149 A1*  5/2016  Zelsacher ......... H01L 29/66568
                                                           438/17

* cited by examiner

*Primary Examiner* — Wasiul Haider
(74) *Attorney, Agent, or Firm* — Yudong Kim; Frank D. Cimino

(57) ABSTRACT

A method of forming an integrated circuit on a substrate is described herein. The method includes forming a first doped region of a detection structure on the substrate, the first doped region comprises a first doped conductivity type. The method forming a capacitor of the detection structure, which includes forming a second doped region of a second conductivity type opposite the first doped conductivity type, the second doped region surrounded by the first doped region. The second doped well comprises a top surface area smaller than a top surface area of the first doped region. The method includes performing parametric testing on the capacitor over a plurality of breakdown voltages. The method includes determining the gate oxide integrity of the capacitor based on the parametric testing over the plurality of breakdown voltages.

15 Claims, 11 Drawing Sheets

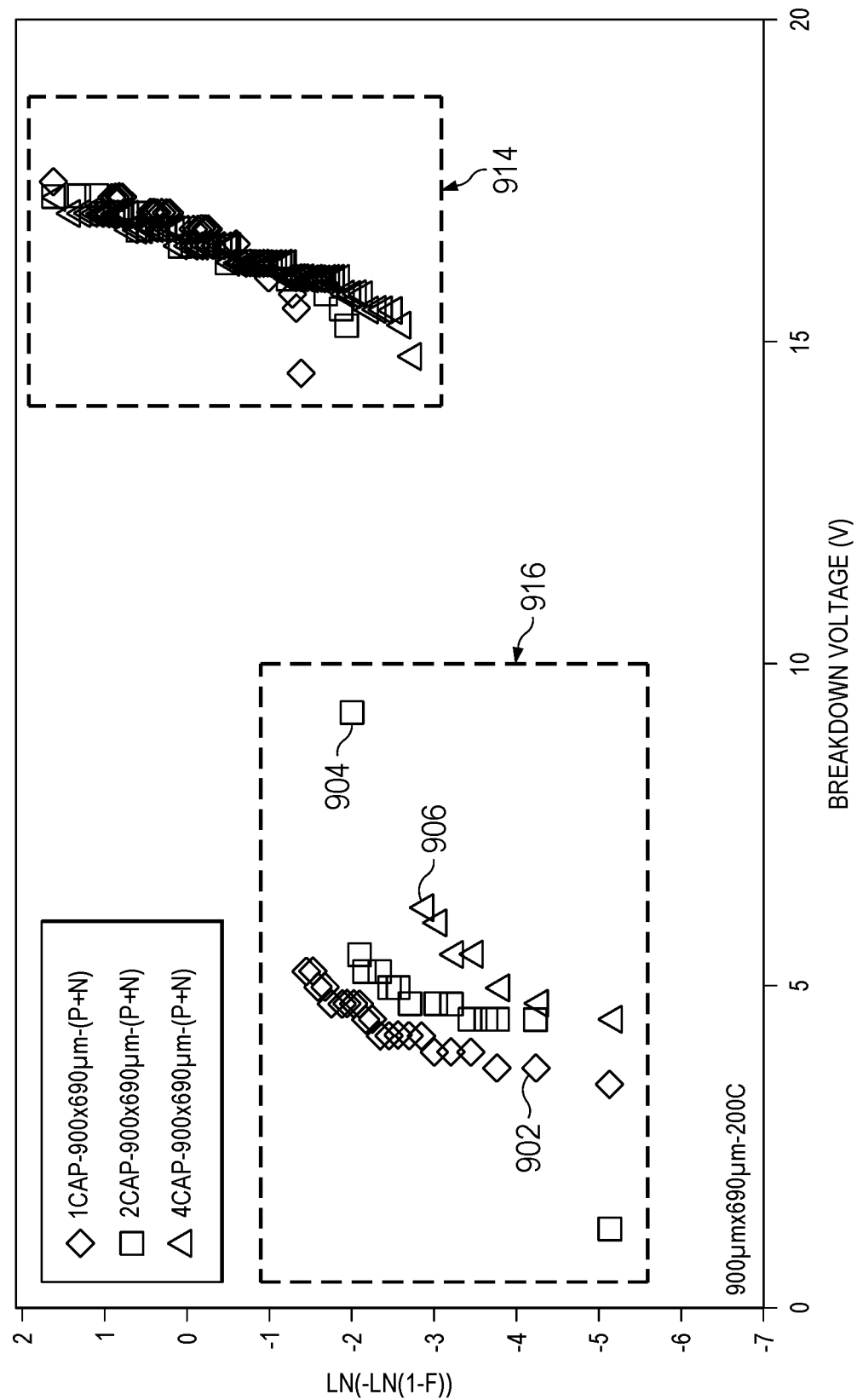

CONTAMINATION DETECTION METHOD

TECHNICAL FIELD

Examples of the present disclosure generally relate to semiconductor electronic circuits and, in particular, to evaluating gate oxide integrity for semiconductor microchips.

BACKGROUND

Gate oxide integrity (GOI) is a critical metric for the effective functioning of transistors. With scaling of semiconductor devices, the gate oxides of these semiconductor devices have become thinner to the extent that present day semiconductor devices use oxides on the range 12-24 Angstroms. This makes them more susceptible to defects, which are detrimental to eventual failures of the semiconductor devices. Defects cause enhanced leakage and eventually premature (non-intrinsic) breakdown of oxides. The GOI integrity needs to be evaluated early in the semiconductor device processing in the front end of the line (FEOL) to prevent unnecessary, wasteful utilization of time and resources in the back end of the line (BEOL).

Specifically, contamination has been a challenging GOI issue for semiconductor manufacturing because contamination sources are plentiful. Contamination can cause gate oxide failure at time zero and/or can cause early failures during operation. However, the detection of contaminates has been challenging because the evidence of contaminates is nearly always blown away during gate oxide breakdown. Although the amount of contaminates is high enough to cause issues with the gate oxide, the amount might not be not high enough to be detected visually or physically.

For example, some 5V capacitors of semiconductor devices fail due to the high amount of contaminates collected during manufacturing from surrounding regions of the semiconductor devices. FIG. 1A illustrates a bulk substrate of a semiconductor device 100 (e.g., a linear bipolar complementary metal-oxide-semiconductor (LBC) device) collecting contaminates. The substrate 105 has an n-type well (NWELL) 115 and a p-type well (PWELL) 120, and during manufacturing of the semiconductor device, the semiconductor device 100 collects contaminates 101. During the manufacturing of semiconductor devices, contaminates 101 diffuse through substrate 105 and collect at the bottom side of the silicon substrate 102 because of the rough nature of the surface of the bottom side of the silicon substrate 102.

FIG. 1B illustrates silicon substrate of another semiconductor device 150 (e.g., an LBC device with a silicon-on-insulator (SOI) substrate) collecting contaminates. Like the silicon substrate 105 of FIG. 1A, the semiconductor device 150 includes a silicon substrate 155 with an NWELL 165 and a PWELL 170. However, unlike the bulk silicon substrate 105 of FIG. 1A, the bottom side of the silicon substrate 155 is processed and is coupled to an oxide layer 160 and accordingly does not have a rough side for contaminates 101 to collect. Accordingly, contaminates 101 introduced during the manufacturing process do not collect at the bottom side of the silicon substrate 155 and can't diffuse through the oxide layer 160 to reach the bottom side of the oxide layer 160. Instead, the contaminates 101 introduced during the manufacturing process collect in the NWELL 165 of the silicon substrate 155 since the highly distressed and/or deformed surface of NWELL 165 replaces the rough surface of the back side of substrate 155 and become the new preferred collector of the contaminates in SOI device 150. The contaminates collect in the NWELL 165 instead of the PWELL 170 because of the rougher surfaces resulting from the doping implants to the NWELL 165 compared to PWELL 170. Specifically, the high dose of dopants to the NWELL 165 are normally larger atoms, such as phosphorus, arsenic, and even antimony, that can cause significantly more deformations of the silicon lattice compared to smaller atoms, such as boron used in PWELL implant, so the NWELL 165 surface is rougher than PWELL 170. The rougher NWELL surfaces attract the contaminates 101 from the substrate 155 and from PWELL 170 with less rough surface and become a contaminate preferred collector. Consequently, more contaminates 101 collect at the NWELL 165 of the semiconductor device 150, and thus increase the likelihood of failure of the gate oxide that grows on the top of the NWELL. This GOI failure could lead to the failures of the semiconductor device 150.

Contamination as described can result in device leakage, reliability failure, premature failures, early failures, shifts in threshold voltages, and/or poor breakdown characteristics in bipolar and MOS devices, as well as in diodes and passive devices.

Currently, there is not an effective system or method to measure contamination density and to quantify the impact of the contaminations on GOI during the semiconductor microchip manufacture itself. Existing end/or conventional methods use a GOI testing structure with large gate oxide area. The conventional thinking is the large gate oxide area can have higher probability to catch defects. While a larger gate oxide does have a higher probability to catch most defects, but the larger gate oxide may not necessarily catch contaminates since the contaminates can be averaged out across the large gate oxide area or along its perimeter, and never reach the critical contaminate density level that is required to cause a GOI failure. As a result, the testing structure with large gate oxide area can be far less sensitive to the contamination GOI issue. In addition, the existing GOI testing structure can be influenced by the surrounding structures, which can make the GOI testing structure artificially sensitive to contaminations or far less sensitive to the ones.

Furthermore, failure analysis is used to find the root cause of a GOI issue. However, failure analysis often cannot find physical evidence of contaminates, which are often blown away during breakdown, and furthermore, failure analysis is not sensitive enough to detect a tiny amount or a part per billion (ppb) level of contaminates, which can still cause GOI failures.

Therefore, what is needed, is an effective method that tests gate oxide integrity and quantify the impact of contaminations on GOI. The method also needs to be sensitive, effective and, efficient for contaminations. in order to provide timely feedback and thus control process excursions, reduce yield loss and minimize the reliability risk.

SUMMARY

This Summary is provided to comply with 37 C.F.R. § 1.73, requiring a summary of the invention briefly indicating the nature and substance of the invention. It is submitted with the understanding that it will not be used to interpret or limit the scope or meaning of the claims.

According to some examples, a method of forming an integrated circuit on a substrate for collecting contaminates is described herein. The method generally includes forming a first doped region of a detection structure on the substrate, the first doped region comprises a first doped conductivity type. The method generally includes forming a first capacitor of the detection structure, which includes forming a second doped region of a second conductivity type opposite the first doped conductivity type, the second doped region surrounded by the first doped region. The second doped well comprises a top surface area smaller than a top surface area of the first doped region. Forming the first capacitor of the detection structure includes forming a dielectric layer on the second doped region. Forming the first capacitor of the detection structure includes forming an electrode deposited on the dielectric layer, where the other electrode of the detection capacitor is the substrate itself. After the formation of the detection capacitors, the method generally includes performing parametric testing on the capacitor over a plurality of breakdown voltages. The method generally includes determining the gate oxide integrity of the capacitor based on the parametric testing over the plurality of breakdown voltages.

According to some examples, a semiconductor device for collecting contaminates is described herein. The semiconductor devices generally includes a handle wafer, a buried oxide layer disposed on top of the handle wafer, and a silicon substrate on the top of the buried oxide layer. The first detection structure is on the substrate. The first detection structure of the semiconductor device includes a first doped well of a first doping conductivity type; and a first capacitor comprising a second doped well of a second doping conductivity type opposite the first doping conductivity type. The second doped well is surrounded by the first doped well and includes a top surface area smaller than a top surface area of the first doped well.

According to some examples, a structure for collecting contaminates is described herein. The structure includes an integrated circuit die and a detection structure disposed in a substrate, the detection structure disposed adjacent to the integrated circuit die. The detection structure includes a first n-type doped well. The detection structure includes a first p-type doped well disposed around the first n-type doped well. The detection structure includes a first gate oxide disposed on the first n-type well. The detection structure includes a first electrode disposed on the gate oxide. The first n-type doped well includes a top surface area smaller than a top surface area of the first p-type doped well.

These and other examples may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 9 is a graph illustrating the impact of the number of capacitors in a fixed size area surrounded by deep trenches on the contamination detection sensitivity, according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
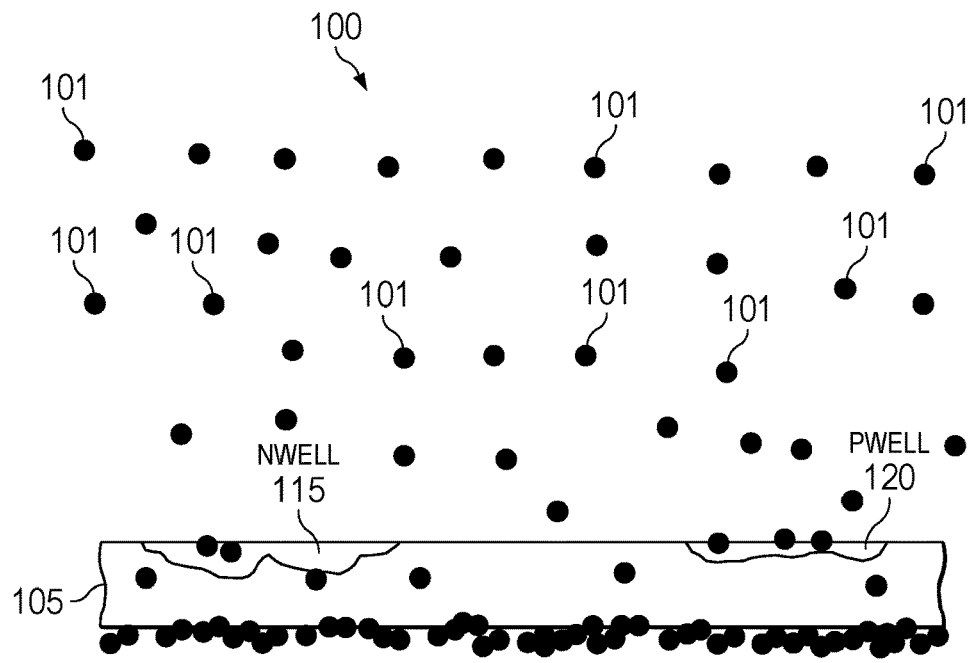
FIGS. 1A and 1B are cross-sectional views of a semiconductor device contaminated during manufacturing.
Figure 1B:
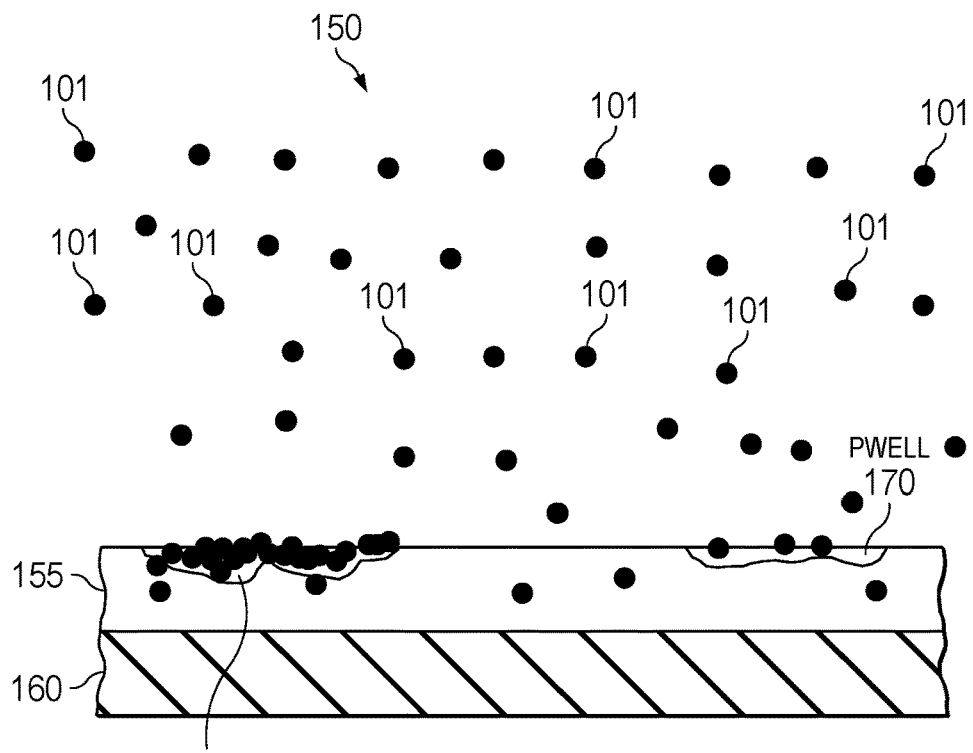

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples described herein include a semiconductor device that can be used in a breakdown test to detect contamination. The semiconductor device comprises a substrate, a doped buried layer, and a detection structure disposed on the doped buried layer. The deep trench includes a p-type doped region and a capacitor having an n-type doped region. The capacitor of the detection structure is comparatively smaller than the p-typed doped region of the detection structure. Because of the size difference between the capacitor and the p-type doped region, the capacitor is virtually defect free, and the capacitor collects contaminates from the surrounding regions in the detection structure into the n-type doped well of the capacitor. The capacitor can quickly reach a critical contamination density level, at which the gate oxide of the capacitor fails, by collecting all the contaminants in the deep trench into the n-type doped region. Furthermore, performing parametric tests on the capacitor of such semiconductor device can provide breakdown voltage distributions, which indicates contamination severity of the semiconductor device.

The semiconductor device described herein can be included on multiple locations on a wafer, and can be used as an in-site production monitor during parametric tests. The semiconductor device described herein provides quick feedback on contamination risk and can increase wafer yield in the production line compared to failure analysis, which occurs at least a few months later after production.

Figure 2:
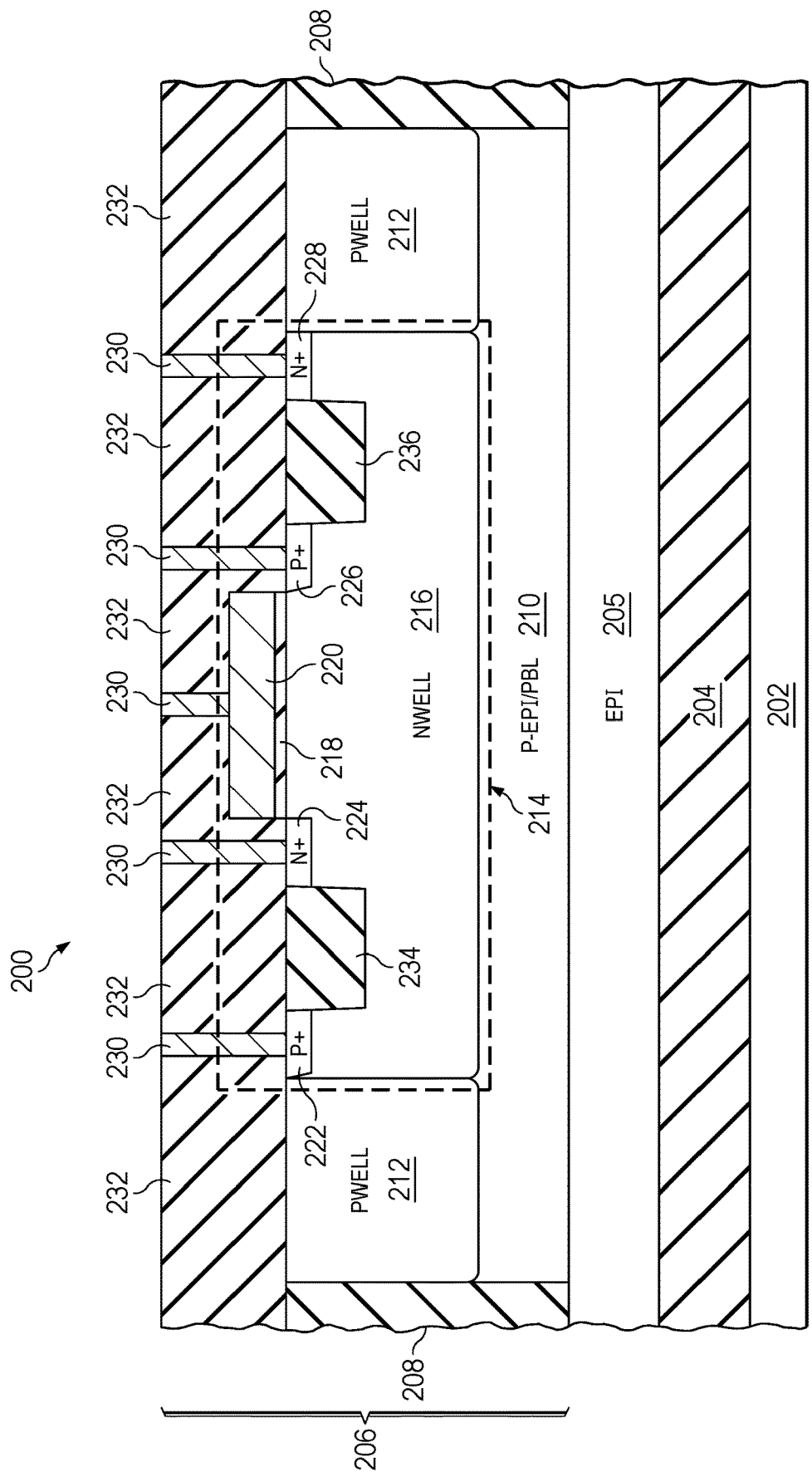
FIG. 2 is a cross-sectional view of a semiconductor device with a detection structure for collecting contaminates, according to some examples.

FIG. 2 is a cross-sectional view of a semiconductor device with a detection structure for collecting contaminates, according to some examples. The semiconductor device 200 includes a substrate 202, a buried oxide layer 204, and the detection structure 206. The semiconductor device 200 can be a linear bipolar complementary metal-oxide-semiconductor (BiCMOS) (LBC) device, or an LBC silicon-on-insulator (SOI) device. The features of the semiconductor device 200 of FIG. 2 may not be to scale relative to each other, and are scaled for illustrative purposes.

The substrate 202 of the semiconductor device 200 can be a semiconductor substrate (e.g., a single crystal semiconductor handle substrate, such as a single crystal silicon handle wafer). In some examples, the substrate 202 may be formed using silicon, SOI, gallium arsenide, or other suitable material or combination of materials. The substrate 202 may be doped with p-type dopants (e.g., group III elements of the periodic table). FIG. 2 shows an SOI substrate.

In the case of an SOI substrate, a buried oxide layer 204 is disposed on the substrate 202. The buried oxide layer 204 is present over the substrate, in the typical manner for SOI structures. In some examples, the buried oxide layer 204 is typically silicon dioxide, and can be referred to as a buried insulator layer. The buried oxide layer 204 isolates the detection structure from the underlying substrate, effectively eliminate parasitic nonlinear junction capacitances to the substrate and reducing collector-to-substrate capacitances. A semiconductor layer 205 overlies the buried oxide layer 204. The semiconductor layer 205 may, for example, be comprised of one or more layers of epitaxial silicon.

The detection structure 206 is disposed on the buried oxide layer 204. The detection structure 206 includes a deep trench isolation oxide 208, a doped region 210, a p-type doped well (PWELL) 212, and a capacitor 214. In some examples, the detection structure 206 can further include contacts 230 coupled and/or connected to the capacitor 214 for testing the gate oxide integrity of the capacitor 214.

In some examples, the detection structure 206 has a deep trench oxide structure 208. This deep trench 208 forms an enclosure of a contamination detection structure. The formation of structure 208 starts with photolithography patterning on the semiconductor layer 205, then following by silicon etching that goes all the way through the entire semiconductor layer 205 to stop at the surface of the buried oxide 204. After etching and etch cleaning, a thin thermal oxide liner grows on the silicon surface within the deep trench, following by sub-atmospheric chemical vapor deposition (SACVD) of silicon dioxide that fills the deep trench and forms a deep trench isolation or a tank for the detection capacitor. Then, chemical-mechanical polishing removes the excessive silicon oxide on the surface of the silicon substrate. As a result, the deep trench 208 is filled with a dielectric material to isolate the doped region 210 of the detection structure 206, and then within the isolation tank, PWELL 212 and NWELL 216 are formed by ion implantation.

Figure 3:
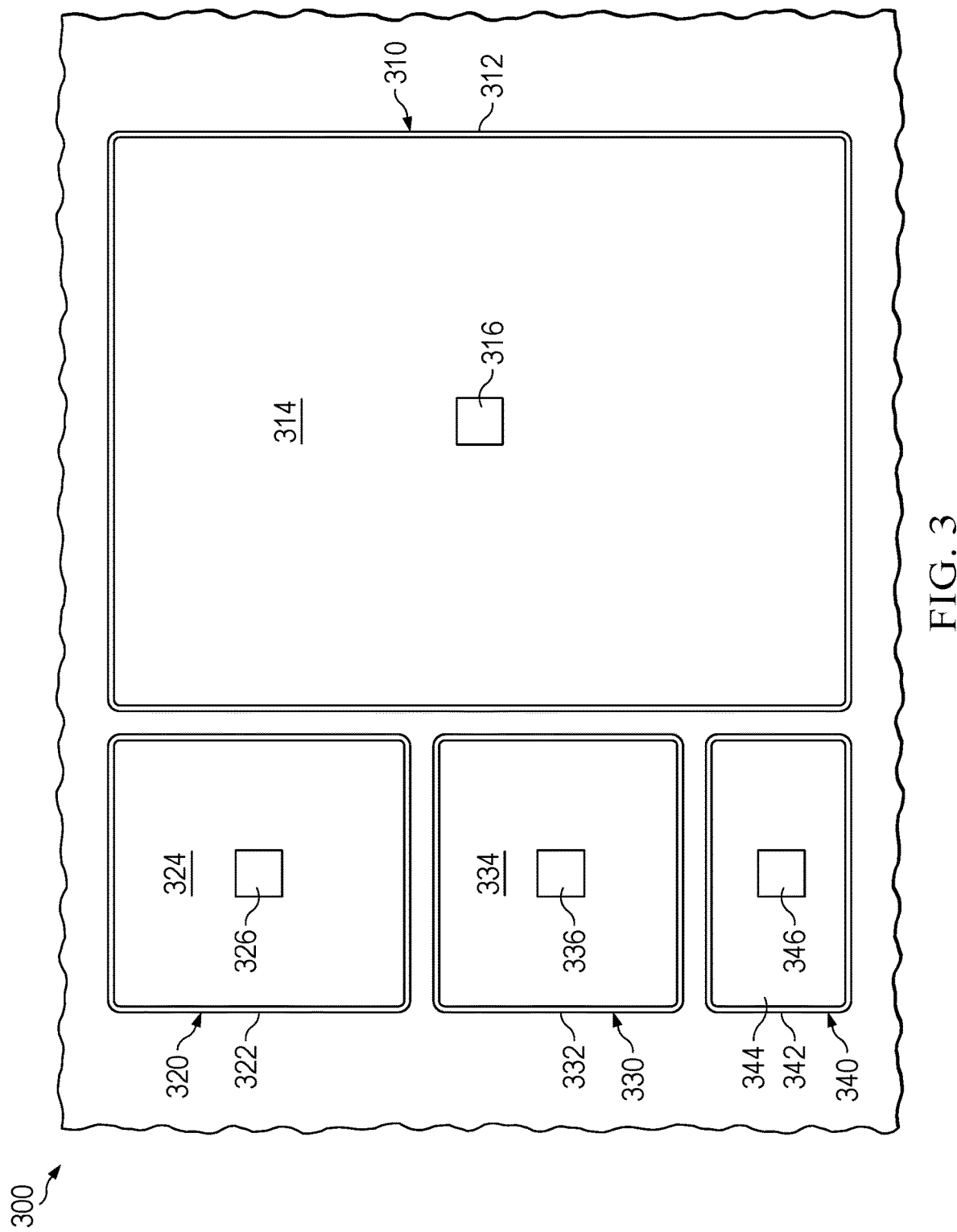
FIG. 3 is a top view of example semiconductor devices with detection structures for collecting contaminates, according to some examples.

Because FIG. 2 is a cross-sectional view of the semiconductor device 200 having a detection structure, the PWELL 212 and the deep trench isolation oxide 208 are shown as two separate regions, but FIG. 3 shows a top view of the detection structure with the PWELL 212 surrounding the capacitor 214 and the isolation oxide 208 surrounding the PWELL 212.

The deep trench isolation oxide 208 of the detection structure 206 is disposed on the substrate 202 (and on the buried oxide 204), and is generally a thermal oxide that has a thickness in the range of 50 A to 1000 A. In some examples, the deep trench isolation oxide can be formed by a Low-Pressure Chemical Vapor Deposition (LPCVD), SACVD process, or a dielectric liner deposition process. Formation of the deep trench isolation oxide 208 can be followed by a trench dielectric etch process to achieve a uniform thickness of the deep trench isolation oxide 208 along the sidewalls of the detection structure. In some examples, the deep trench isolation oxide 208 may include silicon dioxide formed by a thermal oxidation process.

The doped region 210 is a p-type buried layer formed by incorporating p-type dopants in the semiconductor layer 205. The doped region 210 can be developed by incorporating dopants during epitaxial growth of the semiconductor layer 205 or by deep ion implantation into the semiconductor layer 205. The doped region 210 isolates active circuitry of the semiconductor device 200 from the underlying substrate, a handle wafer, effectively eliminate parasitic nonlinear junction capacitances to the substrate and reducing collector-to-substrate capacitances.

The PWELL 212 of the detection structure 206 is formed by ion implantation of p-type dopants, such as boron, into semiconductor layer 205 on top of the doped region 210. The PWELL 212 includes a top side and a bottom side, where the bottom side interfaces with the top side of the doped region 210 of the detection structure 206. The p-type dopants may be implanted in several doses with a total dose of $1\times10^{12}$ cm$^{-2}$ to $1\times10^{14}$ cm$^{-2}$. The PWELL 212 is subsequently annealed to activate the implanted p-type dopants.

The capacitor 214 of the detection structure 206 is disposed on top of the doped region 210. As illustrated, the capacitor 214 is also surrounded by the PWELL 212 (also shown in FIG. 3). The capacitor 214 includes an n-type well (NWELL) 216, a dielectric 218, and an electrode 220. As illustrated, the capacitor 214 is composed of a bottom electrode (e.g., the NWELL 216), a top electrode (e.g., the electrode 220), and the dielectric 218 disposed between the top electrode and the bottom electrode. In some examples, the capacitor 214 further includes contacts 230 coupled to and/or connected to the NWELL 216 and to the electrode 220. As mentioned previously, the capacitor 214 illustrated in FIG. 2 is shown for illustrative purposes and does not reflect the actual size of the capacitor 214 relative to the PWELL 212.

The NWELL 216 forms the bottom layer of the capacitor 214, and is formed by ion implantation of n-type dopants, such as phosphorus, into semiconductor layer 205 on the doped region 210. The NWELL 216 includes a top side and a bottom side, where the bottom side of the NWELL 216 interfaces with the top side of the doped region 210. The n-type dopants may have a total dose of $1\times10^{12}$ cm$^{-2}$ to $1\times10^{13}$ cm$^{-2}$. The NWELL 216 is subsequently annealed to activate the implanted n-type dopants of the NWELL 216.

In some examples, the NWELL 216 further includes highly doped regions 222, 224, 226, 228. The highly doped region 224, 228 are formed by implanting n-type dopants in the NWELL 216, and the highly doped region 222, 226 are formed by implanting p-type dopants in the NWELL 216. One of each type of the highly doped regions 222, 224, 226, 228 are disposed on each side of the dielectric 218 and the electrode 220. For example, the highly doped regions 222 and 224, which are P+ doped and N+ doped respectively, are disposed on one side of the dielectric 218 and the electrode 220, and the highly doped regions 226 and 228, which are P+ doped and N+ doped respectively, are disposed on the other side of the dielectric 218 and the electrode 220. While FIG. 2 illustrates the highly doped region 224 and 226 disposed adjacent to the dielectric 218 and to the electrode 220, the NWELL 216 can have any combination of the highly doped regions 222, 224, 226, 228 disposed adjacent to the dielectric 218 and to the electrode 220. For example, instead of the highly doped regions 224 and 226, the highly doped regions 222 and 228, the highly doped regions 222 and 226, or the highly doped regions 224 and 228 can be disposed adjacent to the dielectric 218 and to the electrode 220.

The capacitor 214 can further include shallow trench isolation (STI) structures 234, 236 disposed between the high doped regions 222, 224, 226, 228. As illustrated, the STI structure 234 is disposed between the highly doped regions 222 and 224, and the STI structure 236 is disposed between the highly doped regions 226 and 228. The STI structure 234, 236 can extend into the NWELL 216. In some examples, the capacitor 214 can include isolation features instead of the STI structures 234, 236, such as field oxide regions and the like. The STI structures 234, 236 (or other isolation features) serve to define various active areas and electrically isolate various active areas from one another.

The dielectric 218 is disposed on the NWELL 216. In some examples, the dielectric 218 is a gate oxide layer. In general, the generic terms oxide, nitride and oxynitride refer to silicon oxide, silicon nitride and silicon oxy-nitride. The term "oxide" may, in general, include doped oxides as well, such as boron and/or phosphorous-doped silicon oxide. The dielectric 218 is formed by thermal oxidation of silicon in the substrate.

The electrode 220 is disposed horizontally on the dielectric 218. The polysilicon is deposited over the dielectric 218, and any unwanted polysilicon and any unwanted portions of the underlying dielectric can be removed by known etching methods. In some examples, instead of the electrode 220 being formed from polysilicon, the electrode 220 can be formed from any other suitable material for forming an electrode over the dielectric 218 (such as polycrystalline silicon doped either p-type or n-type with a silicide formed on top, or a metal such as titanium, tungsten, TiN, tantalum, TaN or other type metal).

As mentioned previously, the detection structure 206 includes contacts 230 coupled to and/or connected to the capacitor 214 of the detection structure 206. Specifically, the contacts 230 are coupled to the highly doped regions 222, 224, 226, 228 of the NWELL 216 of the capacitor 214. One of the contacts 230 is coupled to and/or connected to the electrode 220 of the capacitor 214. These contacts 230 can be formed from tungsten or any other suitable material for contacting the capacitor 214.

In some examples, the semiconductor device 200 further includes a top dielectric layer 232 formed over the detection structure 206. This top dielectric layer 232 can be patterned and etched so as to form openings for the contacts 230 to the detection structure 206. The top dielectric layer 232 comprises for example, SiO2 (doped or undoped with preferable dopants such as boron or phosphorous) possibly with a layer of hydrogen or deuterium containing silicon nitride. Formation of the top dielectric layer 232 and contacts 230 may be formed by various means and any such process is contemplated as falling within the scope of the present invention. The top dielectric layer 232 can be a thick field oxide to avoid premature breakdown of the dielectric 218.

FIG. 3 includes a top view of a semiconductor device with example detection structures for collecting contaminates, according to some examples. The features of the semiconductor device 300 of FIG. 3 may not be to scale relative to each other, and are scaled for illustrative purposes. FIG. 3 illustrates detection structure 310, detection structure 320, detection structure 330, and detection structure 340. Each detection structure is surrounded by a deep trench. For example, each of the detection structures 310, 320, 330, and 340 includes a deep trench isolation oxide 312, 322, 332, 342 surrounding a p-type doped region 314, 324, 334, 344. The area enclosed by the deep trench is also called a tank. Each detection structure 310, 320, 330, and 340 also includes a capacitor 316, 326, 336, 346 surrounded by the respective p-typed doped region 314, 324, 334, 344. With a given capacitor size or area, the tank area that is enclosed by the deep trench varies, so, does the area ratio between the capacitor area and the tank area. This change determines the sensitive of each contamination detection structure.

The detection structures 310, 320, 330, and 340 can have a variety of sizes. For example, detection structure 310 measures 900 µm by 690 µm, detection structure 320 measures 500 µm by 200 µm, detection structure 330 measures 300 µm by 200 µm, and detection structure 340 measures 100 µm by 200 µm. The detection structures 310, 320, 330, and 340 are large enough so that the total available contaminates collected from the detection structures 310, 320, 330, and 340 reaches the critical contamination density to cause gate oxide failure. Furthermore, as the detection structures increases in size, the total available contaminates of the detection structure increases.

The capacitors 316, 326, 336, 346, compared to the size of the area of the detection structures 310, 320, 330, and 340 respectively, is relatively small. The small size of the capacitors 316, 326, 336, 346 reduces the likelihood of defects during manufacturing, so that the capacitors 316, 326, 336, 346 can be considered random defect free. Furthermore, a smaller capacitor reaches critical contamination density more quickly than a larger capacitor. In some examples, the capacitors 316, 326, 336, 346 measures 20 µm by 20 µm, and this size of capacitor can be used with any of the detection structures 310, 320, 330, and 340. The small size of the capacitors 316, 326, 336, 346 differs from prior art solutions where capacitors have been sized to maximize area to save on die size, whereas the capacitor of the detection structure is minimized as much as possible.

In some prior art solutions, the gate oxide integrity (GOI) module is sized as large as possible in order to detect defect issues. The large area of the GOI module made the GOI module less sensitive to contaminations due to the average-out effect. Furthermore, prior GOI modules lack a deep trench, and without a deep trench and corresponding PWELL, contaminates would be able to diffuse anywhere and would not be formed to go to the capacitor, as compared to the capacitor disposed in a deep trench, because the deep trench prevents diffusion of the contaminates into the rest of the semiconductor device.

Because of the size of the detection structures, the detection structures can be disposed anywhere on a semiconductor device, and the semiconductor device can have any number or combination of detection structures.

Figure 4:
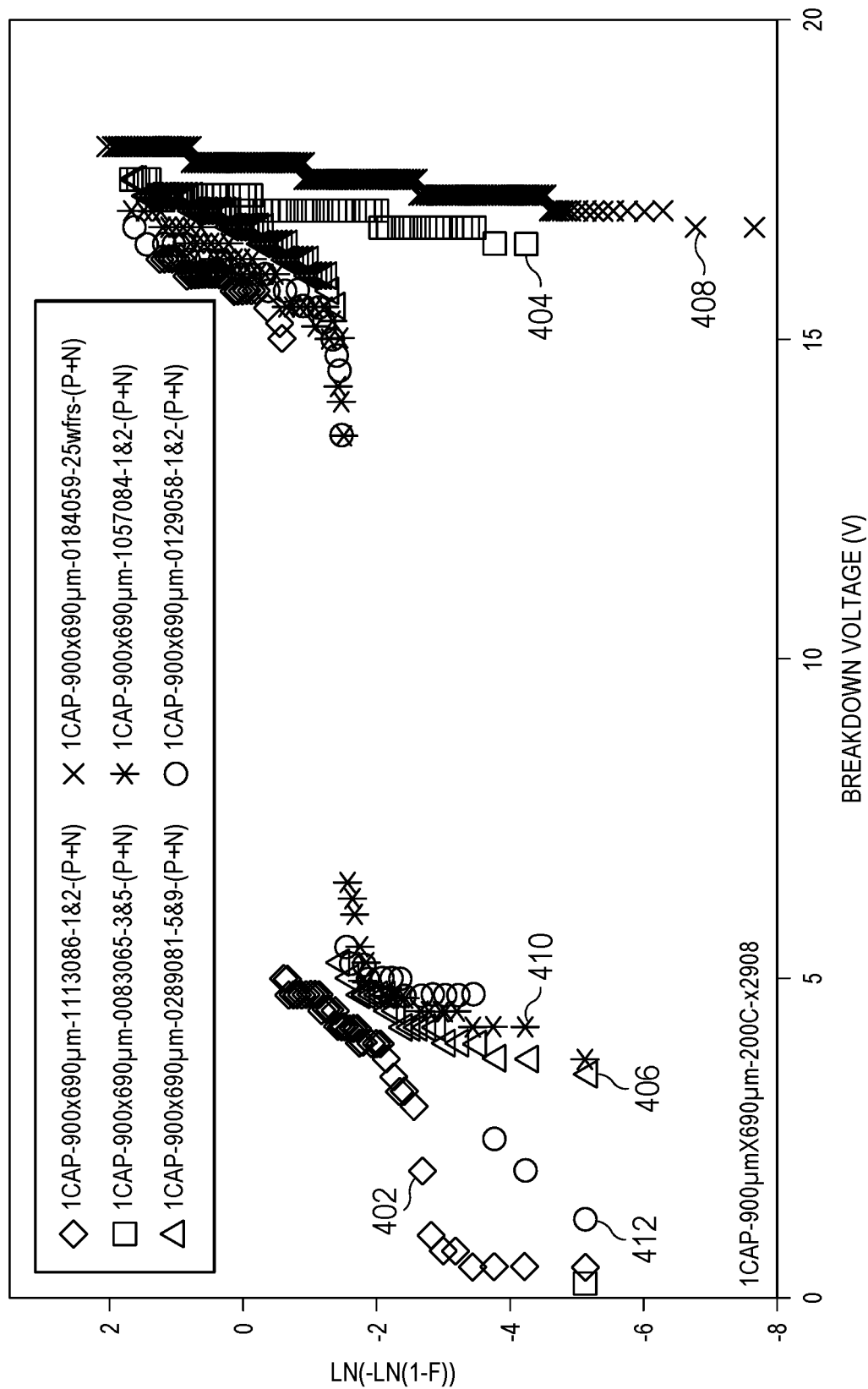
FIG. 4 is a graph illustrating the impact of contaminations on gate oxide integrity (GOI) for different detection structures, according to some examples.

FIG. 4 is a graph illustrating the impact of contaminations on GOI. Specifically, the impact of the contaminates on the GOI is reflected on the distribution of the gate oxide breakdown voltage in one of the detection structures: a detection structure with one capacitor in a larger tank (900 µm×690 µm) (e.g., detection structure 310 in FIG. 3), according to some examples. As illustrated in FIG. 4, the x-axis of graph 400 is the gate oxide breakdown voltages and the y-axis of graph 400 is a Weibull plot. The breakdown voltages of the gate oxide are on the right side of the graph 400, such as distributions 404 and 408, near 17V, which correspond to gate oxides with little to no defects. Meanwhile, the lower breakdown voltages on the left side of the plot near 0V, such as distributions 402, 406, 410, 412, 416, correspond to gate oxides with more defects. The lower breakdown voltage is or the larger deviation from the distributions 404 and 408 on the right side is, the poorer or worse gate oxide quality is. This poor GOI is caused by contaminations collected within the NWELL below the capacitor of the detection structure. Each of the distributions 402, 404, 404, 406, 408, 410, 412, 416 correspond to gate oxides with different semiconductor materials of the contamination detection structure. Accordingly, the materials used for the gate oxides corresponding to distributions 404 and 408, indicating the respective detection structures have little to no intrinsic design flaws. Additionally, the poor breakdown values of distributions 402, 406, 410, 412, and 416 indicate the poor gate oxide quality or integrity of the respective detection structures that is caused by contaminates collected in the NWELL under the gate oxide. The breakdown value indicates the contamination severity.

Figure 5:
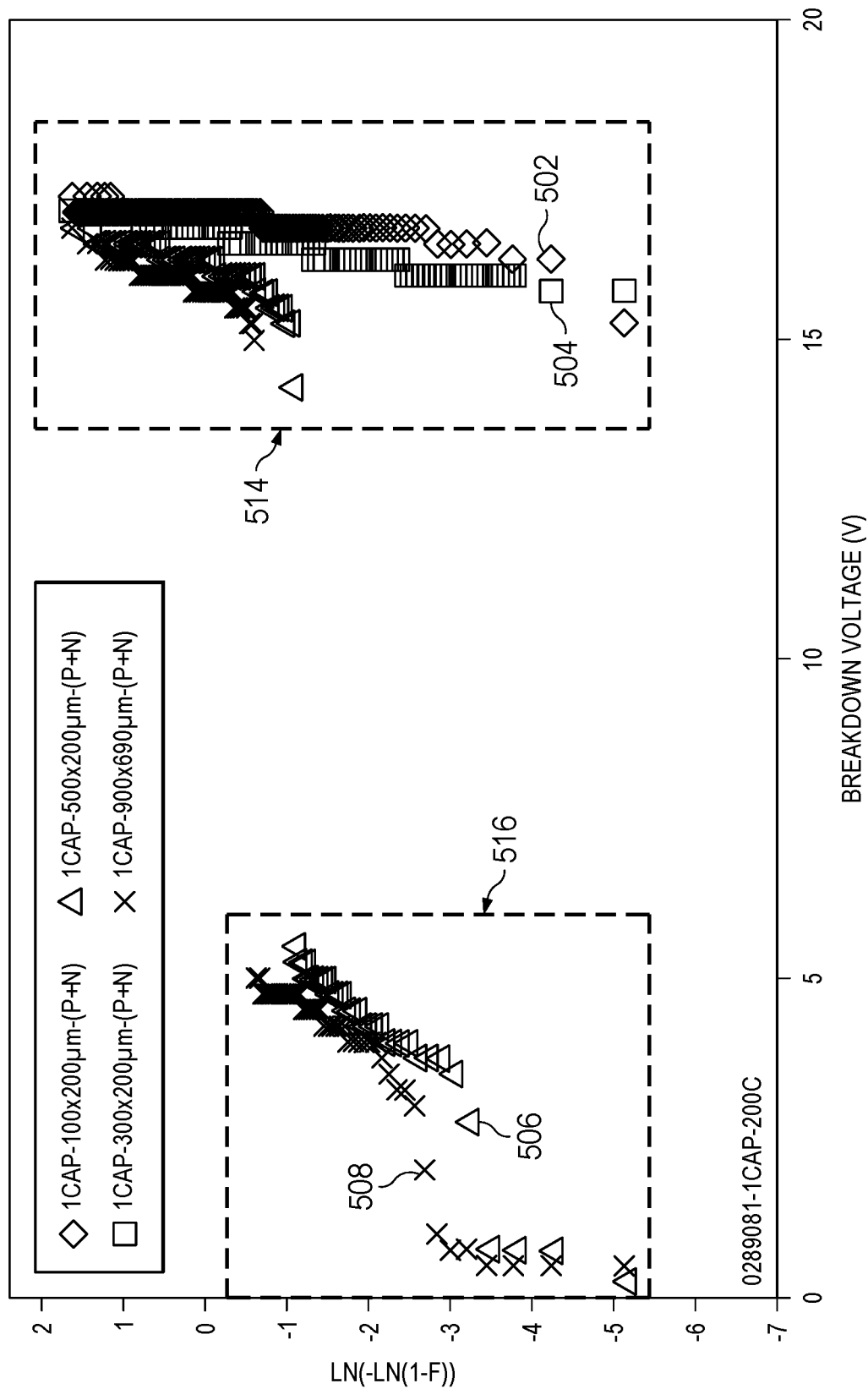
FIG. 5 is a graph illustrating the contamination detection sensitivity of each detection structure, according to some examples.

FIG. 5 is a graph illustrating contamination density sensitivity of detection structures of various sizes, according to some examples. The contamination density sensitivity of the detection structures is reflected on the distribution of the gate oxide breakdown voltage in each detection structure with a fixed capacitor area, but different tank sizes. The graph 500 shows distributions 502, 504, 506, and 508 of breakdown tests of the detection structures. Specifically, the graph shows distribution 502 of a breakdown test of the detection structure 340 of FIG. 3, distribution 504 of a breakdown test of the detection structure 330 of FIG. 3, distribution 506 of a breakdown test of the detection structure 320 of FIG. 3, and distribution 508 of a breakdown test of the detection structure 310 of FIG. 3. Each of distributions 502, 504, 506, and 508 are split into two groups: tails 514 and outliers 516. The voltage breakdown test applied to the detection structures can indicate the contamination severity As illustrated, each of the distributions 502, 504, 506, and 508 include a tail 514. However, only distributions 506 and 508 are included in the outliers 516 because the distributions 506 and 508 are from a breakdown test of detection structure 320 of FIG. 3 and detection structure 310 of FIG. 3. These detection structures 310, 320 of FIG. 3 are larger than the detection structures 330, 340 of FIG. 3. As the size of the detection structure increases, the total available contaminates within the detection structure increases. Accordingly, with a larger amount of available contaminates to the NWELL below the gate oxide, the same size capacitor can reach critical contamination density easier compared to the smaller tank or smaller deep trench isolation enclosure. Once the critical contamination density is reached, the breakdown value degrades from the value of 17V. The lower the breakdown voltage is, the higher contamination density is inside the NWELL below the gate oxide.

Figure 6:
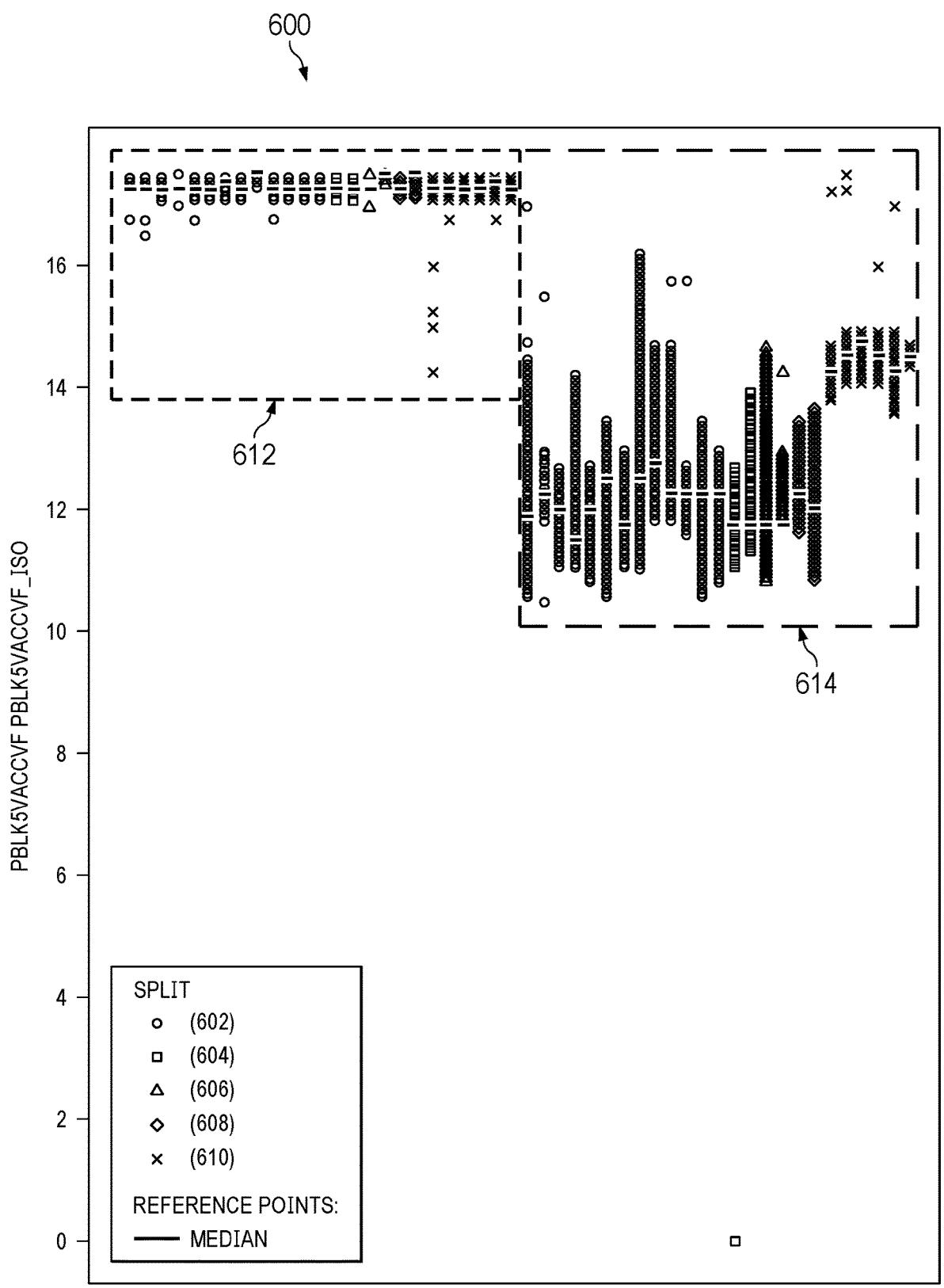
FIG. 6 is a graph illustrating the effectiveness of a contamination detection structure, according to some examples.

FIG. 6 is a graph 600 illustrating the effectiveness of a contamination detection structure, according to some examples. For illustrative purposes, the distribution 612 corresponds to a prior GOI structure and the distribution 614 corresponds to a detection structure a contamination detection structure as described herein. Further, for purposes of illustrating the effectiveness of the contamination detection structure corresponding to distribution 614, the contamination detection structure is on the same wafer as the prior GOI structure corresponding to distribution 612. The detection structure (corresponding to distribution 614) detects contaminations with large gate oxide breakdown voltage variation compared to little breakdown voltage variation of the GOI structure (corresponding to distribution 612).

The vertical spread of distribution 612 and 614 each shows how well the breakdown test detects contaminations. As illustrated, the distribution 612 are distributed vertically in a relatively small range, while the distribution 614 have a much larger vertical distribution range. The larger vertical spread of distribution 614 demonstrates that a breakdown test can detect contaminates better with a detection structure compared to prior GOI structures.

Figure 7:
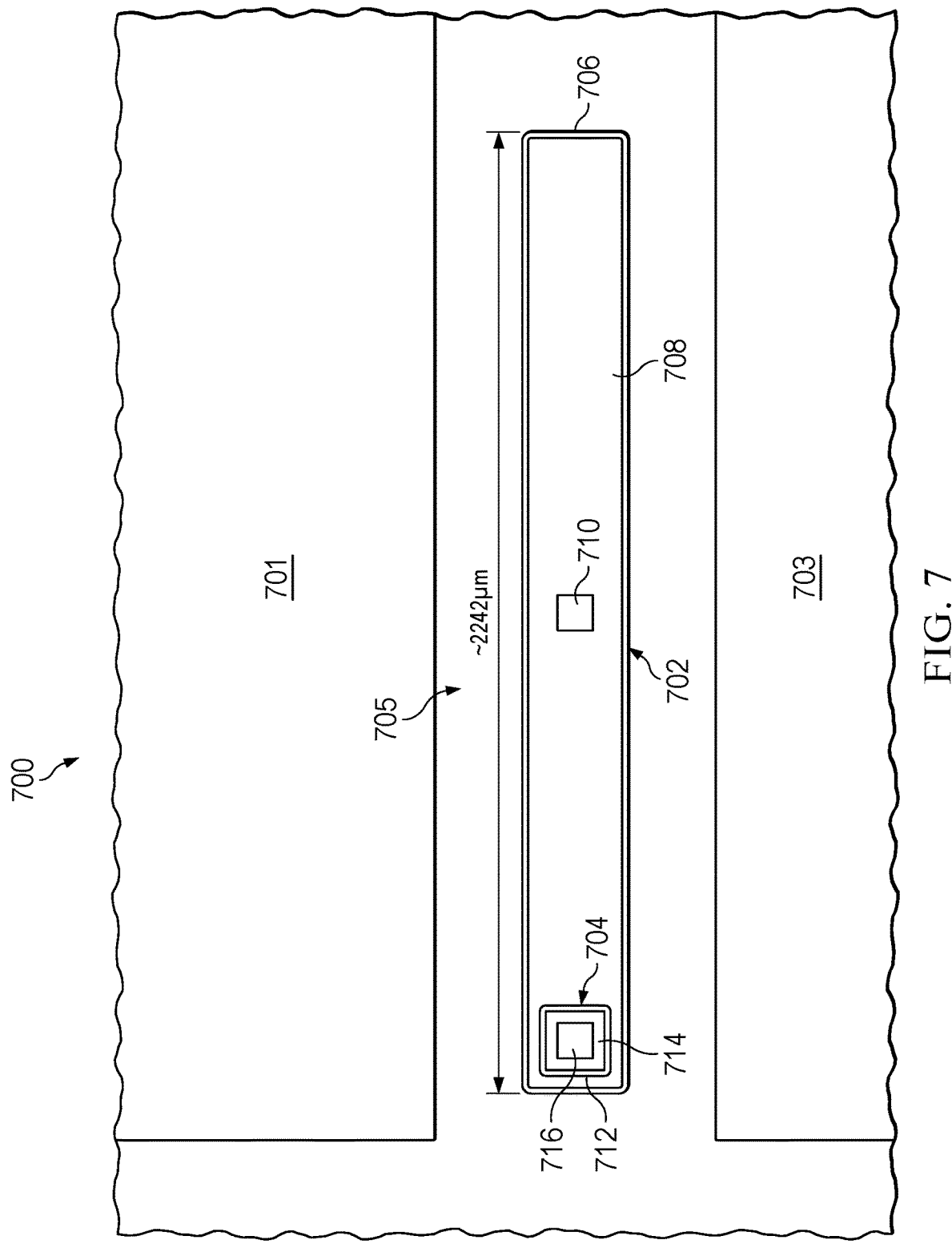
FIG. 7 is a top view of example semiconductor devices with detection structures within an area surrounded by a deep trench or deep trenches, according to some examples.

FIG. 7 is a top view of example semiconductor devices with detection structures within a tank surrounded by a deep trench or deep trenches, according to some examples. The semiconductor device 700 of FIG. 7 illustrates two detection structures 702, 704, with detection structure 704 disposed inside detection structure 702. The detection structure 702 is disposed in a scribe module or a scribe line 705 between die 701 and die 703. Like the detection structures of FIG. 2 and FIG. 3, the detection structure 702 includes a deep trench isolation oxide 706, a PWELL 708, and a capacitor 710. Similarly, the detection structure 704 disposed in the detection structure 702 also includes a deep trench isolation oxide 712, a PWELL 714, and a capacitor 716.

As mentioned previously, detection structures 702, 704 can vary in size depending on placement on a semiconductor device, and the detection structure 702 of FIG. 7 can have a size of about 2242 µm by about 24 µm in order to fit in a scribe line or scribe module. In some examples, the detection structure 702 can be sized to give about 100,000 µm² of isolated area enclosed by the deep trench isolation oxide 706. The capacitor 710 of the elongated detection structure 702, like other capacitors described herein can have a size of about 20 µm by 20 µm and can collect the contaminates within the detection structure 702. The deep trench isolation oxide 706 of the detection structure 702 can have similar features as described with the deep trench isolation oxide 208 of detection structure 206 of FIG. 2. The PWELL 708 of detection structure 702 can have similar features as described with the PWELL 212 of detection structure 206 of FIG. 2. Additionally, the capacitor 710 of detection structure 702 can have similar features as described with the capacitor 214 of detection structure 206 of FIG. 2.

As illustrated, in some examples, a detection structure 704 can be disposed in the PWELL 708 of another detection structure 702. In such examples, the detection structure 704 can be formed like other detection structures: by etching the detection structure from the PWELL 708 of the detection structure 702, forming a deep trench isolation oxide 712 of the detection structure 704, a PWELL 714 of the detection structure 704, the capacitor 716 of the detection structure 704, and other features of the detection structure 704. Because of the deep trench isolation oxide 712, contaminates disposed in or on the detection structure 704 collect at the capacitor 716 instead of the capacitor 710 of detection structure 702.

The deep trench isolation oxide 712 of the detection structure 704 can have similar features as described with the deep trench isolation oxide 208 of detection structure 206 of FIG. 2. The PWELL 714 of detection structure 704 can have similar features as described with the PWELL 212 of detection structure 206 of FIG. 2. Additionally, the capacitor 716 of detection structure 704 can have similar features as described with the capacitor 214 of detection structure 206 of FIG. 2.

Figure 8A:
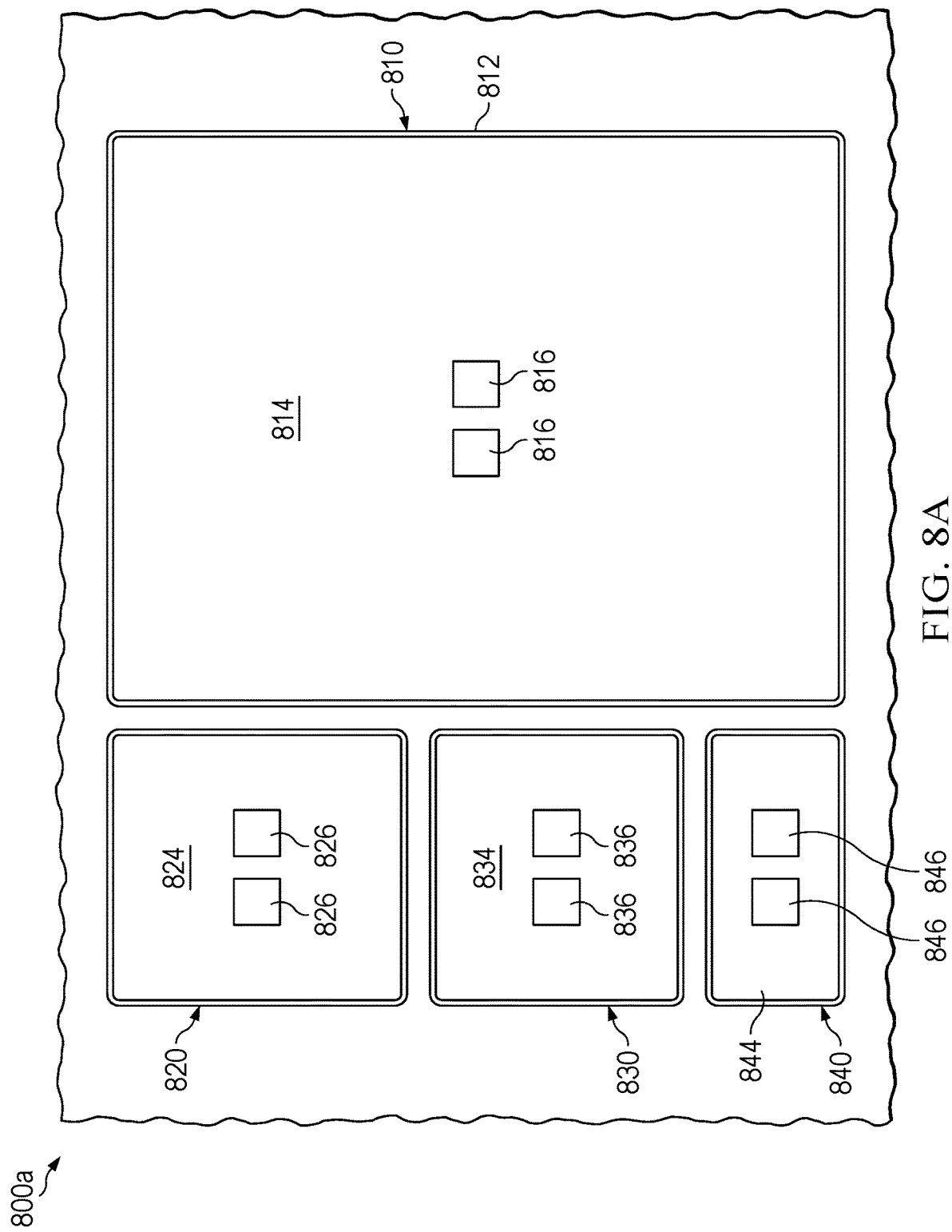
FIGS. 8A and 8B are top views of example semiconductor devices with detection structures for collecting contaminates, according to some examples.
Figure 8B:
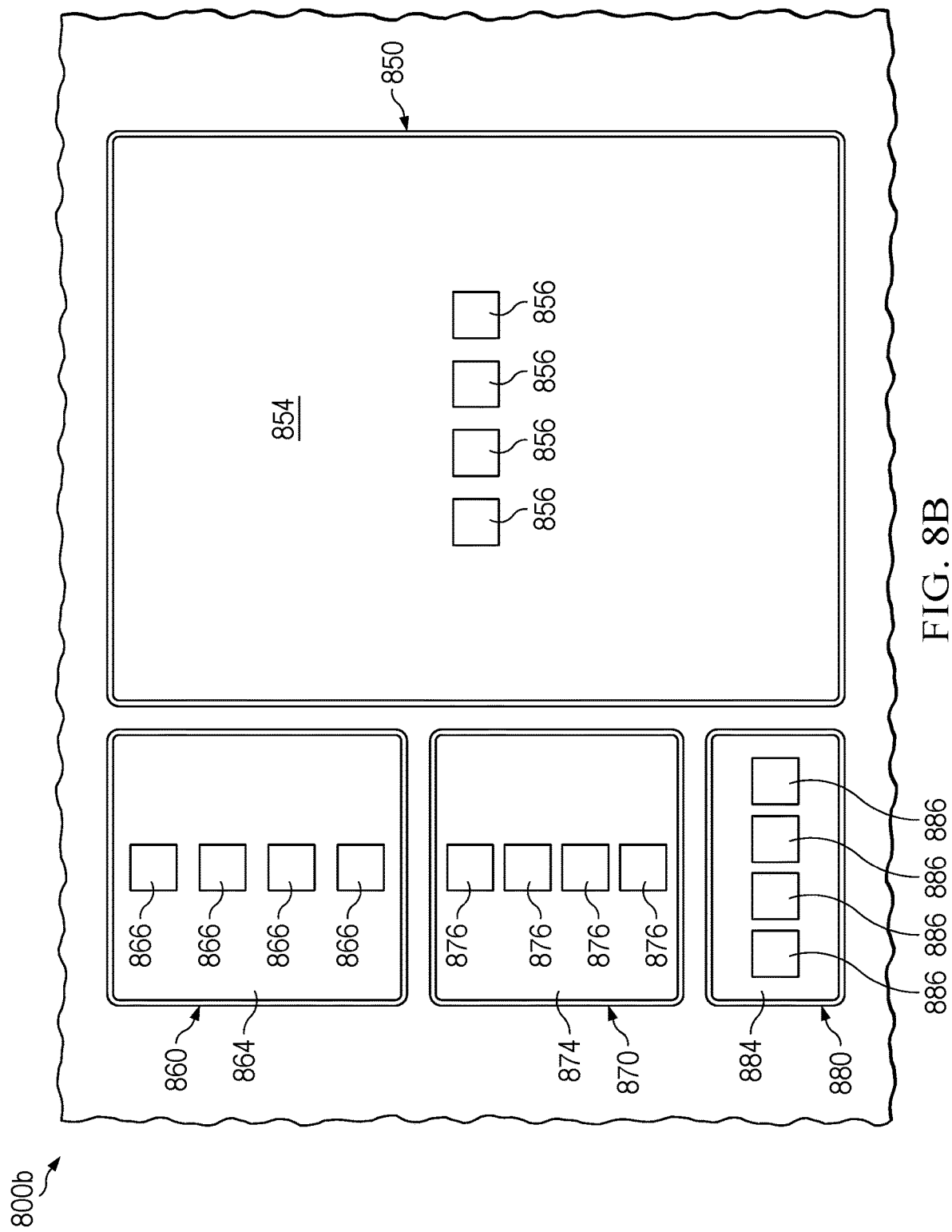

FIGS. 8A and 8B are top views of example semiconductor devices with detection structures for collecting contaminates, according to some examples. As with FIG. 3, FIGS.

8A and 8B show multiple detection structures, and the sizes of these detection structures may be combined in any arrangement or combination. Also, as illustrated in FIGS. 8A and 8B, each of the detection structures have multiple capacitors. In FIG. 8A, each of the detection structures 810, 820, 830, 840 have two capacitors 816, 826, 836, 846, while in FIG. 8B, each of the detection structures 850, 860, 870, and 880 have four capacitors 856, 866, 876, 886. The additions of capacitors increase the total area of the capacitor in a fixed tank area, which leads to the ratio changes between the capacitor area and the tank area. This ratio changes affect the contamination detection sensitivity. While FIGS. 8A and 8B show detection structures with two or four capacitors, other detection structures as described herein can any number of capacitors. The features of the detection structures 810, 820, 830, 840, 850, 860, 870, and 880 can be the same as the features of the detection structure 206 of FIG. 2.

As mentioned, FIG. 8A shows detection structures 810, 820, 830, 840, each with two capacitors 816, 826, 836, 846. The detection structure 810 measures 900 μm by 690 μm, detection structure 820 measures 500 μm by 200 μm, detection structure 830 measures 300 μm by 200 μm, and detection structure 840 measures 100 μm by 200 μm. The sizes listed here are for illustrative purposes and detection structures can be sized as needed in order. As shown, the capacitors 816, 826, 836, 846 of respective detection structures 810, 820, 830, 840 are disposed adjacent to each other and separated from each other by the PWELL 814, 824, 834, 844 of each respective detection structure 810, 820, 830, 840.

Additionally, as mentioned, FIG. 8B shows detection structures 850, 860, 870, and 880, each with four capacitors 856, 866, 876, 886. The detection structure 810 measures 900 μm by 690 μm, detection structure 820 measures 500 μm by 200 μm, detection structure 830 measures 300 μm by 200 μm, and detection structure 840 measures 100 μm by 200 μm. The sizes listed here are for illustrative purposes and detection structures can be sized as needed in order. As shown, the capacitors 856, 866, 876, 886 of each detection structure 850, 860, 870, and 880, respectively, are disposed adjacent to each other and separated from each other by the PWELL 854, 864, 874, 884 of each respective detection structure 850, 860, 870, and 880. In some examples, the capacitors 856, 866, 876, 886 of each detection structure 850, 860, 870, and 880 are disposed in a row or column. In other examples, the capacitors 856, 866, 876, 886 of each detection structure 850, 860, 870, and 880 can be disposed in any formation. For example, the capacitors 856, 866, 876, 886 can be disposed in a 2×2 formation of capacitors. Some arrangements of the capacitors 856, 866, 876, 886 may assist in collecting contaminates for reaching the critical contaminate density for the capacitors 856, 866, 876, 886.

Increasing the number of capacitors of the detection structure does decrease the rate at which each of the capacitors would reach critical contamination density because the total amount of contaminates would be spread out between the multiple capacitors. For example, in the case of detection structures 810 with two capacitors 816, the total amount of contaminates that can be collected by the two capacitors 816 is the same as if the detection structure had one capacitor, but the total amount of contaminates collected is split into two groups for each of the two capacitors 816. According, in such example, the capacitors do not reach gate oxide failure as quickly.

FIG. 9 is a graph illustrating the impact of the number of capacitors in a fixed size tanks on the contamination detection sensitivity, according to some examples. The contamination detection sensitivity is reflected in the distribution of gate oxide breakdown. The graph 900 shows distributions 902, 904, and 906 of breakdown tests of the detection structures. Specifically, the graph shows distribution 902 of a breakdown test of the detection structure 310 of FIG. 3, distribution 904 of a breakdown test of the detection structure 810 of FIG. 8A, and distribution 906 of a breakdown test of the detection structure 850 of FIG. 8B. As illustrated in FIG. 9, each of distributions 902, 904, and 906 are split into two groups: tails 914 and outliers 916. The voltage breakdown test applied to the detection structures can indicate the contamination severity. Furthermore, as illustrated, as the number of capacitors of the detection structure increase, the tails 914 of the respective detection structure become smaller because contaminates are averaged out across the capacitors. As mentioned, the additions of capacitors increase the total area of the capacitor in a fixed tank area, which leads to the ratio changes between the capacitor area and the tank area. This ratio changes affect the contamination detection sensitivity. Accordingly, the detection structure corresponding to distribution 906 is more contamination detection sensitive than the detection structure corresponding to distribution 902.

Figure 10:
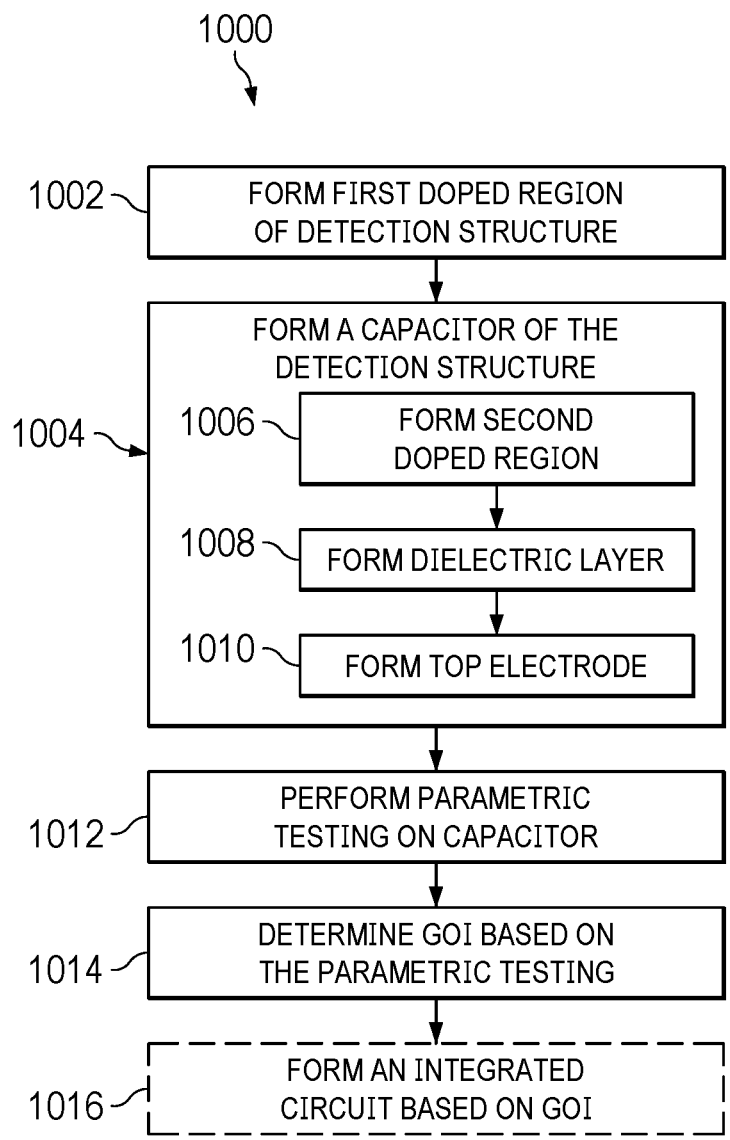
FIG. 10 is a flowchart of operations for forming an integrated circuit with a detection structure on a substrate, according to some examples.

FIG. 10 is a flowchart of operations for forming an integrated circuit with a detection structure on a substrate, according to some examples. The integrated circuit with detection structure can collect contaminates in order to determine gate oxide integrity of the integrated circuit.

Operations 1000 begin with step 1002, which involves forming a first doped region of a detection structure of an integrated circuit. The first doped region includes a first doped conductivity type. The first doped region of the detection structure can be the PWELL 212 of FIG. 2.

Operations 1000 continue with step 1004, which involves forming a capacitor of the detection structure. In some examples, the capacitor is formed on a buried oxide layer, which in turn is disposed on a substrate of the integrated circuit. The capacitor can be the capacitor 214 of FIG. 2.

Forming the capacitor of the detection structure involves forming a second doped region (step 1006). The second doped region includes semiconductor material having a second doping conductivity type opposite the first doping conductivity type. The second doped region is surrounded by the first doped region of the detection structure. The second doped region has a top surface area smaller than the top surface area of the first doped region. In some examples, the first doped region and the second doped region can be disposed on a doped region, such as a p-type epitaxial layer or a p-type buried layer. The second doped region can be the NWELL 216 of FIG. 2. In some examples, the second doped region can include highly doped regions, such as highly doped regions 222, 224, 226, and 228 of FIG. 2. The second doped region can also include STI structures disposed between highly doped regions, such as STI 234 and 236.

After forming the second doped region of the capacitor, a dielectric layer is formed on top of the second doped region of the capacitor (step 1008). The dielectric layer can be dielectric 218 of FIG. 2, and the dielectric can be the gate oxide layer of the capacitor.

After forming the dielectric layer on the second doped region of the capacitor, a top electrode is formed on top of the dielectric layer (step 1010). The top electrode can be the electrode 220 of FIG. 2, and can be formed of a polysilicon material.

In some examples, operations 1000 can include forming deep trench isolation oxides. These deep trench isolations oxides can be formed around the first doped region, and where the detection structure includes a bottom doped region (e.g., a p-type epitaxial layer, a p-type buried layer, or doped region 210 of FIG. 2), the deep trench isolation oxides are disposed adjacent to the first doped region and the bottom doped region. Operations 1000 can also include form a top dielectric layer (e.g., top dielectric layer 232 of FIG. 2) over the capacitor and over the first doped region. Operations 1000 can also include forming contacts (e.g., contacts 230 of FIG. 2) coupled to and/or connected to the capacitor, at the electrode or to highly doped regions of the second doped region.

Operations 1000 continues with step 1012 involving performing parametric testing on a capacitor of a detection structure of a semiconductor device. The semiconductor device can be the semiconductor device 200 of FIG. 2, the detection structure can be the detection structure 206 of FIG. 2, and the capacitor can be the capacitor 214 of FIG. 2.

The nature and design of the detection structure of the semiconductor device allows for operations 1000 to be performed during manufacturing of the integrated circuit. Operations 1000 continue with step 1014 involving determining the gate oxide integrity of the semiconductor device based on the parametric testing on the capacitor. The parametric tests performed on the capacitor of the detection structure can determine the gate oxide integrity of the capacitor. Specifically, step 1014 involves determining whether the gate oxide has failed because of the accumulated contaminates of the capacitor.

Based on the determined gate oxide integrity, operations 1000 can continue with forming an integrated circuit (step 1016). For example, if the determined GOI indicates that the gate oxide has not failed, operations 1000 can continue with forming the integrated circuit. However, if the determined GOI indicates the gate oxide as failed, then the integrated circuit is not formed.

Operations 1000 can continue with back end of line (BEOL) processing and packaging of the semiconductor device.

The semiconductor substrates may include various elements therein and/or layers thereon. These can include barrier layers, other dielectric layers, device structures, active elements and passive elements including, source regions, drain regions, bit lines, bases, emitters, collectors, conductive lines, conductive vias, etc. Moreover, the invention can be based on a variety of processes including CMOS, BiCMOS and BCD (Bipolar-CMOS-DMOS) technologies.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the following claims.

What is claimed:

1. A method of forming an integrated circuit, the method comprising:
    forming a first doped region of a detection structure on a substrate, the first doped region comprises a first doping conductivity type;
    forming a first capacitor of the detection structure, comprising:
        forming a second doped region of a second doping conductivity type opposite the first doping conductivity type, the second doped region laterally surrounded by the first doped region, wherein the second doped region comprises a top surface area smaller than a top surface area of the first doped region;
        forming a dielectric layer on the second doped region; and
        forming an electrode disposed on the dielectric layer;
    performing parametric testing on the first capacitor over a plurality of breakdown voltages; and
    determining gate oxide integrity of the first capacitor as a result of performing the parametric testing over the plurality of breakdown voltages.

2. The method of claim 1, further comprising:
    forming the integrated circuit as a result of determining the gate oxide integrity of the first capacitor.

3. The method of claim 1, wherein a plurality of contaminants are attracted to the first capacitor of the detection structure.

4. The method of claim 1, further comprising:
    forming a deep trench isolation oxide around the first doped region of the detection structure.

5. The method of claim 1, wherein at least one length of the first capacitor is 20 µm.

6. The method of claim 5, further comprising:
    forming a second detection structure disposed in the first doped region, comprising:
        forming a third doped region of the first doping conductivity type; and
        forming a second capacitor.

7. The method of claim 6, wherein the third doped region is disposed in the first doped region, and the second capacitor is laterally surrounded by the third doped region.

8. The method of claim 1, further comprising:
    forming a second capacitor of the detection structure, comprising:

forming a third doped well of the second doping conductivity type.

9. The method of claim 8, wherein the second capacitor is disposed adjacent to the first capacitor and separated by the first doped region from the second doped region, and wherein the second capacitor is laterally surrounded by the first doped region.

10. The method of claim 8, wherein a sum of the top surface area of the first capacitor and a top surface area of the second capacitor is smaller than the top surface area of the first doped region.

11. The method of claim 1, further comprising:
forming a deep trench isolation oxide disposed adjacent to the first doped region and laterally surrounding the first doped region.

12. The method of claim 1, wherein an area of the first doped region is 100,000 µm$^2$.

13. The method of claim 1, wherein the detection structure is formed in and along a scribe line of the substrate.

14. The method of claim 1, wherein the first doping conductivity type is p-type and the second doping conductivity type is n-type.

15. The method of claim 1, further comprising:
forming a bottom doped region of the first doping conductivity type, the bottom doped region formed under the first capacitor and under the first doped region.

* * * * *